US006998905B2

(12) United States Patent
North

(10) Patent No.: US 6,998,905 B2
(45) Date of Patent: Feb. 14, 2006

(54) NOISE CANCELLATION CIRCUITS AND METHODS

(75) Inventor: Brian North, Los Gatos, CA (US)

(73) Assignee: Elantec Semiconductor, Inc., Milpitas, CA (US)

(*) Notice: Subject to any disclaimer, the term of this patent is extended or adjusted under 35 U.S.C. 154(b) by 42 days.

(21) Appl. No.: 10/839,013

(22) Filed: May 5, 2004

(65) Prior Publication Data

US 2005/0248393 A1   Nov. 10, 2005

(51) Int. Cl.
*H03K 5/00*   (2006.01)

(52) U.S. Cl. ..................................... 327/551; 327/552
(58) Field of Classification Search ........ 327/551–552, 327/311, 344, 558

See application file for complete search history.

(56) References Cited

U.S. PATENT DOCUMENTS

| | | | | |
|---|---|---|---|---|
| 4,291,343 A | * | 9/1981 | Riddle, Jr. ................... | 360/30 |
| 4,344,150 A | * | 8/1982 | McLaughlin ................. | 708/310 |
| 4,843,488 A | * | 6/1989 | Watatani et al. ............. | 386/100 |
| 4,964,110 A | | 10/1990 | Horimai et al. | |
| 5,498,993 A | * | 3/1996 | Ohtsuka et al. .............. | 327/514 |
| 6,026,071 A | | 2/2000 | Kimura | |
| 6,795,386 B2 | | 9/2004 | Kobayashi | |
| 6,891,875 B2 | | 5/2005 | Nagara et al. | |
| 2005/0135222 A1 | | 6/2005 | Fukutomi et al. | |

OTHER PUBLICATIONS

"A Survey of Methods Using Balanced Photodetection", New Focus, Application Note 14, pp. 1-8.
Phillip C. D. Hobbs, "Reaching the Shot Noise Limit for $10", Apr. 1991, Optics & Photonics News, pp. 17-23.
Chiang, C., "Adaptive Noise Cancellation Using a Hybrid Algorithm," School of Information and Electrical Engineering, The University of Queensland (May 2003).
Haller, K. and Hobbs, P, "Double Beam Laser Absorption Spectroscopy: Shot Noise-Limited Performance at Baseband with a Novel Electronic Noise Canceller," in Optical Methods for Ultrasensitive Detection and Analysis: Technique and Applications, B.L. Feurey, ed., Proc. SPIE 1435, 298-309 (1991).
Milster, T., et al., "Optical Data Storage Readout with Quadrant Pupil Detection," Applied Optics vol. 35, No. 14, pp. 2471-2476 (May 10, 1996).
Wenger, M., "Noise Rejection—The Essence of Good Speech Recognition," Emkay Innovative Products, www.emkayproducts.com/images/pdf/white/NoiseRejection.pdf, pp. 1-13 (believed to be at least as early as 2003).

* cited by examiner

*Primary Examiner*—Dinh T. Le
(74) *Attorney, Agent, or Firm*—Fliesler Meyer LLP

(57) ABSTRACT

Circuits and methods for coherent noise cancellation are provided. More specifically, circuits and methods are provided for coherent cancellation of noise that is present in a data signal due to noise being present in the source signal (e.g., an optical signal) that is used to produce the data signal. The circuits, which use a subtraction process rather than division, are easy to implement in a chip, and provide for wide bandwidth performance.

39 Claims, 8 Drawing Sheets

NOISE CANCELLATION CIRCUITS AND METHODS

FIELD OF THE INVENTION

Embodiments of the present invention relate to coherent noise cancellation circuits and methods, which are useful in the area of optical storage, as well as other areas.

BACKGROUND

A device that is capable of writing data to and reading data from an optical storage media (e.g., a CD or DVD) typically includes a light source and a light detector (also known as an optical pickup). During writing, data is imparted on the media in the form of "bumps" and "lands," which reflect light differently. During reading, the light source, e.g., a laser diode, produces a source light signal that is directed toward the media such that light reflected from the media is modulated with the data stored on the media. The light detector, e.g., one or more photodetectors, detects the light reflected from the media, with the output of the light detector being a data signal. The data signal is typically amplified by a preamplifier before the data signal is provided to an analog to digital converter, etc.

In the past, noise cancellation schemes have primarily focused on reducing noise that is produced at an input stage to the preamplifier, without concern for noise from the light source. However, as data speeds increase, the noise from the source is becoming a more significant portion of the overall noise, approaching the same order of magnitude as the noise from the input stage. Additionally, the next generation of optical storage devices will use blue laser diodes, which are much noisier that conventional laser diodes. Accordingly, there is a need to reduce, and preferably cancel noise from the source.

SUMMARY

Embodiments of the present invention provide for coherent cancellation of noise that is present in a data signal due to noise being present in the signal that is used to produce the data signal.

A source signal, which is split from the signal used to produce the data signal, includes high frequency noise components that are also present in the data signal. In accordance with embodiments of the present invention, this source signal is low pass filtered to produce a first signal that includes low frequency components of the source signal. The source signal is also subtracted from the data signal, to produce a second signal that includes the data signal minus the low and high frequency components of the source signal. The first signal and the second signal are added together to produce an output signal that includes the data signal minus the high frequency noise components of the source signal. Embodiments of the present invention are also directed to circuits that perform such coherent noise cancellation.

Further embodiments, and the features, aspects, and advantages of the present invention will become more apparent from the detailed description set forth below, the drawings and the claims.

DETAILED DESCRIPTION

Embodiments of the present invention provide for coherent noise cancellation. The basic concept of coherent noise cancellation will first be described with reference to FIG. 1.

As described above, during reading, a light source (not shown) produces a source light signal. This source light signal is split (e.g., by a beam splitter) such that a majority of the light signal is directed toward the media (not shown), and a small portion of the light signal is directed toward a monitoring photodetector diode 102 (which is often used in an automatic power control loop). One or more further photodetector diode 112 detects the light after it is reflected from the media. Current produced by the photodetector diodes 102 and 112 are amplified by respective preamplifiers 104 and 114, resulting in a source current signal Is and a data current signal Id, each of which include noise generated by the light source.

Figure 1:
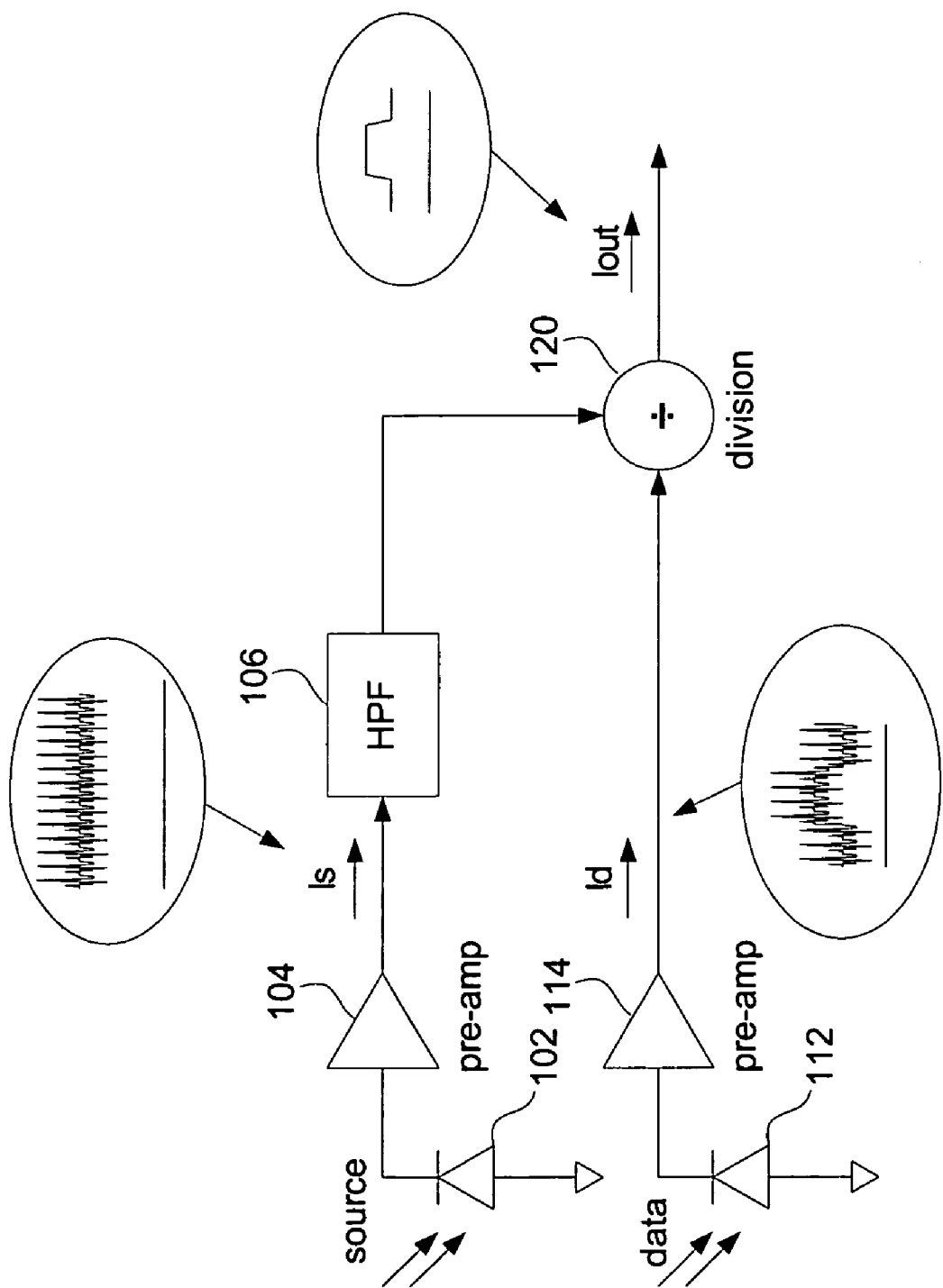
FIG. 1 is a high level block diagram useful for explaining how coherent noise cancellation can be performed using division.

After high pass filtering (e.g., by a high pass filter 106), the source signal Is is combined with the data signal Id in phase so as to null the noise that came from the source that is still present in the data signal Id. For an ideal transfer function the data signal Id would be divided by the source signal Is, e.g., using a divider 120, as shown in FIG. 1. However, accurate division is often difficult to integrate into a chip function.

Figure 2:
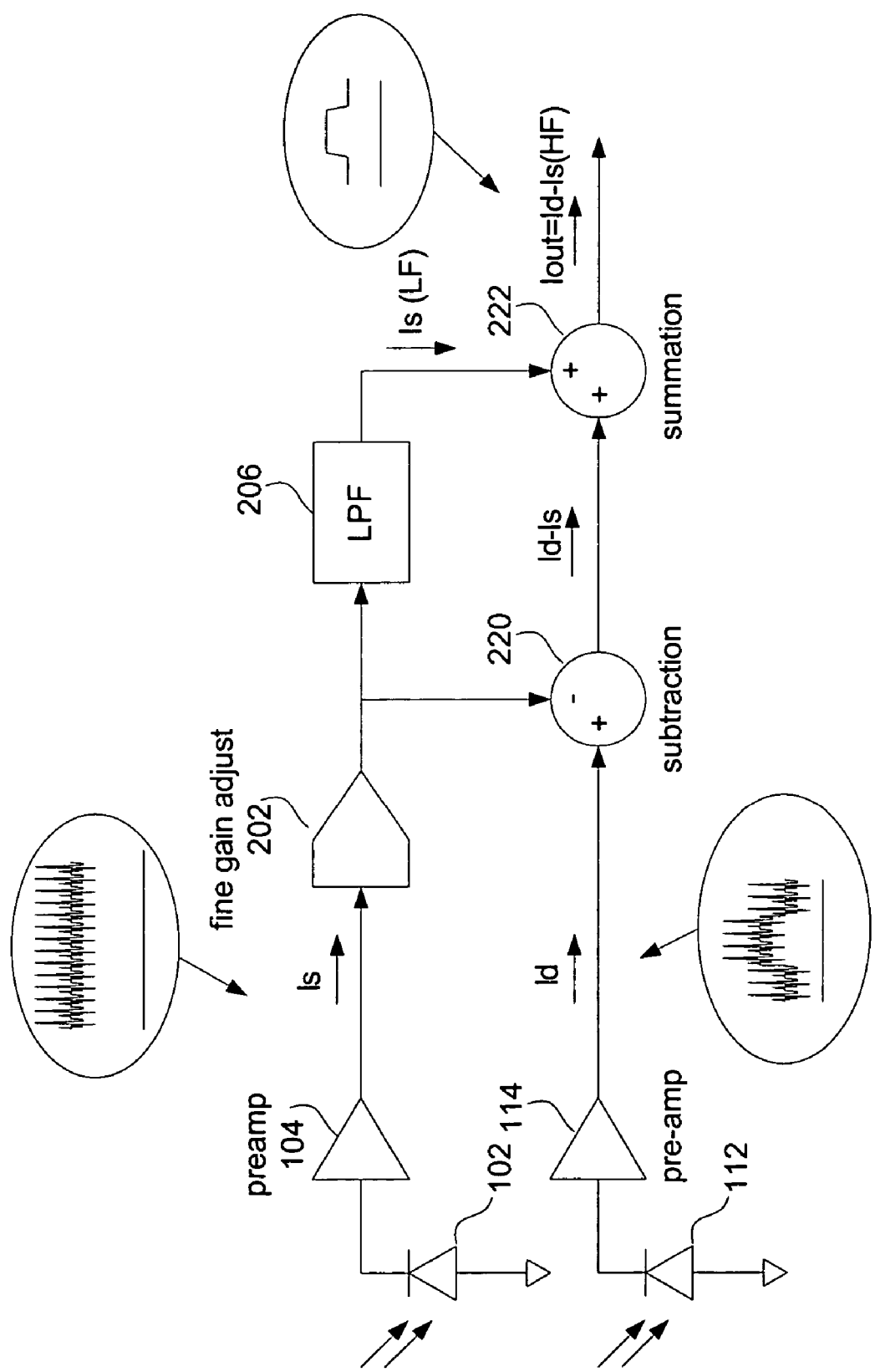
FIG. 2 is a high level block diagram useful for explaining how coherent noise cancellation can be performed using subtraction.

Referring to FIG. 2, rather than performing coherent noise cancellation using division, embodiments of the present invention use subtraction (shown as occurring at block or node 220). Subtraction is used rather than division, because subtraction is more easily integrated into a chip function. More specifically, in accordance with embodiments of the present invention, a source signal Is is subtracted from a data signal Id at a subtraction node 220, resulting in Id−Is at the output of that node. The source signal Is is essentially a DC signal with high frequency noise components. At node 220, both the high frequency (HF) components and the low frequency (LF) components (i.e., the DC signal) of the source signal Is are subtracted from the data signal Id. Thus, if the desire is to subtract out the noise in the source signal Is from the data signal Id (which includes the same noise, since the data signal Id was produced using the source signal Is), it is only the HF components of the source signal Is that should be subtracted from the data signal Id. This can be accomplished by low pass filtering the source signal Is using a low pass filter (LPF) 206, and adding back the LF components of the source signal Is at a node 222, resulting in an output signal Iout that is equal to the data signal Id minus the HF components of the source signal Is, as shown in FIG. 2. In FIG. 2, a fine gain adjustment block 202 is also included, to allow a more near perfect cancellation through subtraction. In the FIGS. the term "Is(HF)" is used to represent HF components of the source signal, the term "Is(LF)" is used to represent the LF components of the source signal, and the term "Is" is used to represent the source signal with both LF and HF components.

Before describing the circuit implementations of the present invention, it is first useful to explain coherent noise cancellation with reference to the following mathematical equations.

The received source signal, Is, can be represented by the following equation:

$$Is=Ks*(S+Ns)$$

where
Ks is the transfer coefficient for the source signal,
S is the original source signal (possible a DC constant), and
Ns is the unwanted noise component present in the source signal.

A received data signal, Id, can be represented by the following equation:

$$Id=(C+M)*Kd*(S+Ns)$$

where
Kd is the transfer coefficient for the data signal,
C is the constant portion of the data signal, and
M is the modulated portion of the data signal (it is the modulated portion of the data signal that contains the useful information).

The most exact method to eliminate the noise from the source from the data signal is to divide the derived data signal by a derived source signal as indicated below:

$$Id\_divided=Id/Is=(C+M)*Kd*(S+Ns)/(Ks*(S+Ns))=(C+M)*Kd/Ks$$

However, as mentioned above, accurate division is often difficult to integrate into a chip function. Accordingly, in accordance with embodiments of the present invention, noise cancellation is achieved using subtraction, as indicated below:

$$Id\_subtract=Id-Ka*s=(C+M)*Kd*(S+Ns)-Ka*Ks*(S+Ns)$$

where
Ka is an added adjustment that is required to balance the gains of the two signal paths.
This equation can be rearranged to give:

$$Id\_subtract=M*Kd*(S+Ns)+(C*Kd-Ka*Ks)*(S+Ns)$$

If the value of Ka is adjusted so that Ka=C*Kd/Ks then $$Id\_subtract=M*Kd*(S+Ns)$$

If the modulation, M, is relatively small compared to the static component of the data signal, C, as is typically the case for optical storage and similar applications, then this represents a significant reduction in the overall noise level.

There are many advantages to using subtraction instead of division in a noise cancellation loop. For example, it is generally simpler to design and implement an intergrated circuit that perform subtraction, than one that performs division. Further, an intergrated circuit that performs subtraction can be made process independent. Additionally, circuits that performs subtraction are faster and have greater precision at higher frequencies than circuits that perform division. Also, circuits that perform subtraction are less effected by offsets than circuits that perform division. Further, with subtraction circuits, accuracy improves with large quiescent DC components (as is typical in optical storage applications).

In accordance with specific embodiments, the signal derived directly from the source can be made proportionally stronger than the data signal derived from the media. This fact reduces the amount of gain required for the cancellation signal and thereby reduces the amount of added noise contributed to the main data channel from the source signal circuitry.

An important implementation detail is the matching of the propagation delays for the two signal paths up until the subtraction process. However, the signal paths are necessary functionally different in order to implement the subtraction process. It is also preferable that one of the two signal paths provides for a fine gain control to gain balance the signal paths for good cancellation performance. Preferably the signals paths can be adjusted such that there gains are within 5% of one another. In addition, the source signal path should provide for filtering to remove the static DC component of the source waveform to ensure that only the noise from the source waveform is used in the cancellation process and not the DC magnitude. These functional differences in the two different signal paths make the propagation delay balancing particularly difficult. Propagation delay matching on the order of less than 200 ps is preferred for good noise cancellation at the faster DVD optical storage rates.

Preamplifiers that provide the input current signals to a subtraction block can be developed using a custom current-configuration approach that provides the added advantage of near constant bandwidth over a complete range of available gain settings. Since the bandwidth is nearly constant, then the propagation delays are held almost constant with different gain settings improving the overall channel balance at high frequencies.

A proposed novel solution to mitigate the above described issues is to combine the three functions (i.e., filtering, fine gain adjustment and subtraction) into a single circuit and to make the signal path for the data signal as simple as possible. Circuit implementations, according to embodiments of the present invention, are describe below.

Circuit Description

Circuit implementations of the present invention will now be described beginning with reference to the high level circuit diagrams of FIGS. 3A and 3B. In the FIGS. the source signal Is and data signal Id (likely provided at the output of respective preamplifiers) are shown as simple current sources.

Figure 3A:
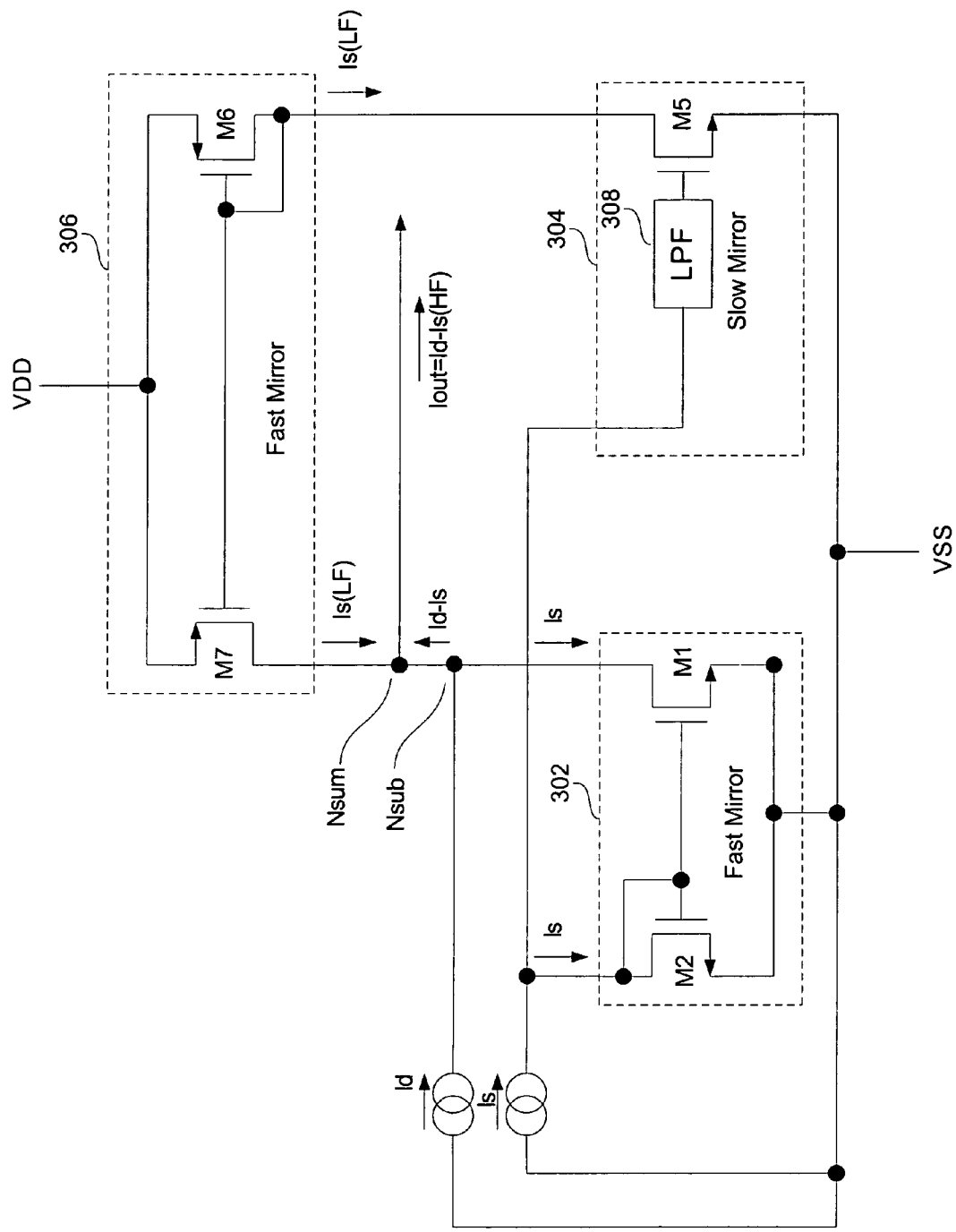
FIG. 3A is a high level circuit diagram that provides coherent noise cancellation using subtraction, in accordance with an embodiment of the present invention.

As shown in FIG. 3A, two fast current mirrors 302, 306 and one slow current mirror 304 are used to implement an embodiment of the present invention. More specifically, the source signal Is is provided to an input of the fast current mirror 302. The data signal Id is provided to a node Nsub that is connected to an output of the fast current mirror 302, resulting Id−Is flowing out of the node Nsub. In other words, the node Nsub performs the subtraction function of node 220 shown in FIG. 2.

The source signal Is is also provided to an input of the slow current mirror 304, which includes a low pass filter (LPF) between its input and output, resulting in only the LF components of the source signal Is at the output of the current mirror 304.

The output of the slow current mirror 304 is connected to the input of the fast current mirror 306, resulting in only the LF components of the source signal Is at the output of the current mirror 306. A node Nsum that is connected at the output of the current mirror 306 adds the LF components of Is to Id−Is (from node Nsub), resulting in an output signal Iout being equal to the data signal Id minus the HF components of the source signal Is. In other words, the node Nsum performs the summation function of node 222 shown in FIG. 2. In this manner, coherent noise cancellation is performed in accordance with an embodiment of the present invention.

The nodes Nsub and Nsum were discussed separately above for ease of description. However, as can be seen from FIG. 3A, these nodes are actually connected together (with no components therebetween, or as seen in FIG. 3B, with a current path of a transistor therebetween). Accordingly, these nodes can be thought of as a single node where the data signal Id is added in, the HF and LF components of the source signal Is are subtracted out, and the LF components of the source signal Is are added back in, resulting in an output signal Iout equal to the data signal Id minus the HF components of the source signal Is.

In accordance with an embodiment of the present invention, the fast current mirror 302 includes a transistor M1 and a transistor M2 that are connected in a common source configuration and a common gate configuration. The gate and the drain of transistor M2 are connected together. The drain of transistor M2 forms the input of the current mirror 302, and the drain of transistor M1 forms the output of the current mirror 304. The transistors M1 and M2 are shown as being NMOS transistors, with their sources connected to a supply voltage rail VSS (e.g., 0V).

In accordance with an embodiment of the present invention, the slow current mirror 304 includes a transistor M5 and transistor M2 that are connected in a common source configuration, with a low pass filter (LPF) 308 connected between the gate of transistor M5 and the gate of transistor M2. Thus, transistor M2 is part of both the fast current mirror 302 and the slow current mirror 304, with the drain of transistor M2 forming the input of both current mirrors 302 and 304. As mentioned above, the input of the current mirror 304 receives the source signal Is. The LPF 308 connected between the gate of transistor M5 and the gate of transistor M2 causes only the LF components of the source signal Is to appear at the output of the current mirror 304.

Stated another way, it can be said that the input of the current 302 is connected to the input of the LPF 308, with the output of the LPF 308 being connected to the control terminal of the transistor M5, wherein the control terminal controls the current flow through a current path of the transistor M5. If transistor M5 is a CMOS transistor, as shown, then the control terminal is the gate terminal, and the current path is the drain source path. As shown in the FIGS. 3A and 3B, the current path is connected to the input of the current mirror 306. If a circuit is implemented using BJT transistors in place of CMOS transistors, then the control terminal of transistor M5 would be a base terminal, and the current path would be a collector emitter path.

In accordance with an embodiment of the present invention, the fast current mirror 306 includes a transistor M6 and a transistor M7 connected in a common source configuration and a common gate configuration. The gate and the drain of transistor M6 are connected together. The drain of transistor M6 forms the input of the current mirror 306, and the drain of transistor M7 forms the output of the current mirror 306. The transistors M6 and M7 are shown as being PMOS transistors, with their sources connected to a supply voltage rail VDD (e.g., 3.3V). It is noted that the LPF 308 shown in FIG. 3A can be moved such that it placed between the gates of transistors M6 and M7, causing current mirror 306 to become a slow current mirror (referred to in the following sentence as a modified current mirror 306). This would result in both the HF and LF components of the source signal Is being provided to the input of the modified current mirror 306, with only the LF components appearing at the output of the modified current mirror 306, thereby causing such a modified embodiment to achieve the same effect as FIG. 3A.

Figure 3B:
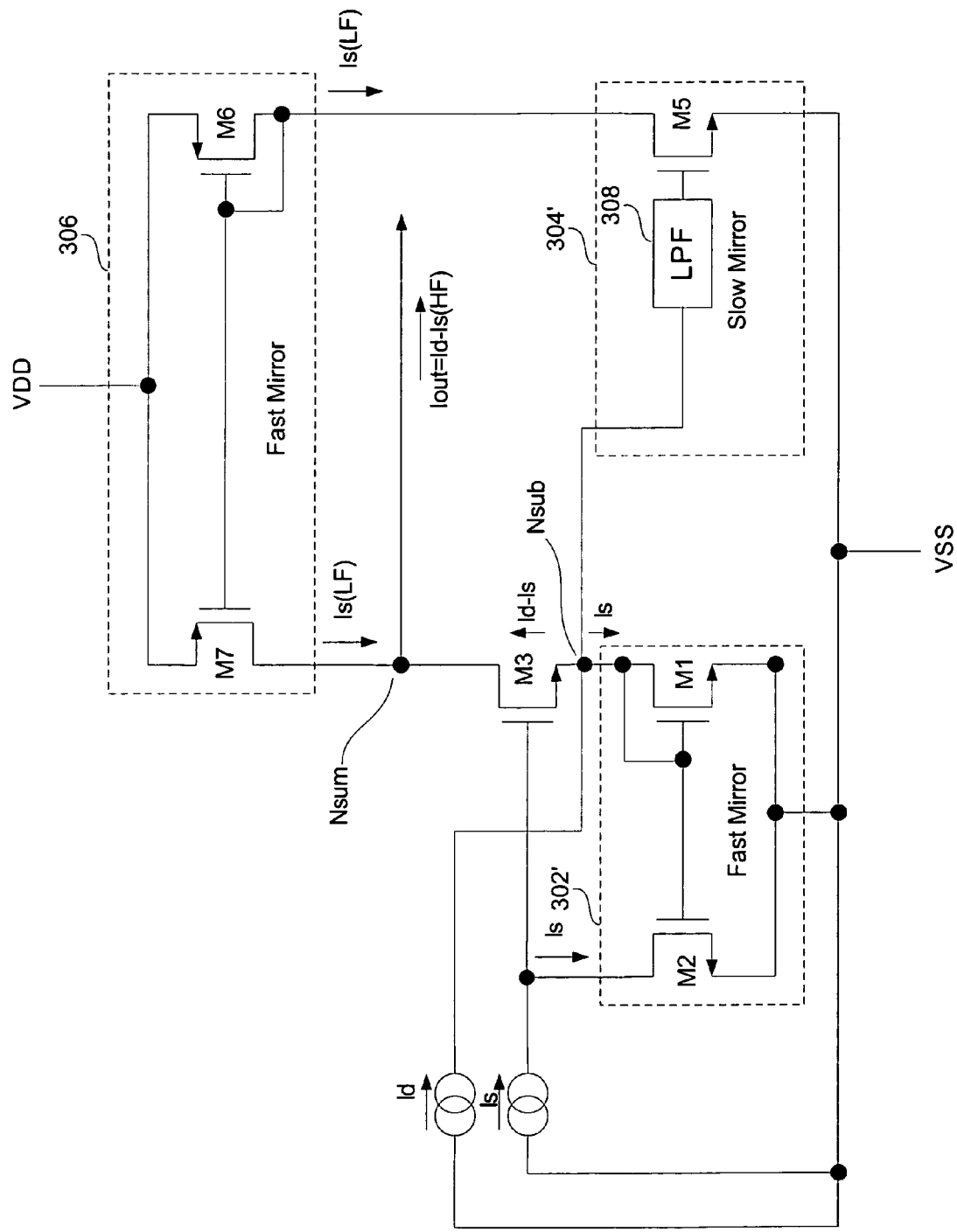
FIG. 3B is a high level circuit diagram that provides coherent noise cancellation using subtraction, in accordance with an alternative embodiment of the present invention.

Referring now to FIG. 3B, in accordance with an alternative embodiment of the present invention, the input and output of the current mirror 302 of FIG. 3A are reversed, and thus, the current mirror is labeled 302' in FIG. 3B. A further transistor M3 is also appropriately added to provide feedback between transistors M1 and M2, so that the current at the drain of transistor M1 and the current at the drain of transistor M2 (i.e., at the input and the output of the current mirror 302') both remain equal to the source signal Is. The circuit of FIG. 3B operates in a similar manner as the circuit of FIG. 3A, with slightly better performance. In this embodiment, the slow current mirror 304' includes transistor M5 and transistor M1 (rather then transistor M2, as was the case in FIG. 3A). Thus, transistor M1 is part of both the fast current mirror 302' and the slow current mirror 304', with the drain of transistor M1 forming the input of both current mirrors 302' and 304. As was the case with FIG. 3A, the LPF 308 in FIG. 3B can be moved such that it located between the gates of transistors M6 and M7, causing the current mirror 306 to become a slow current mirror (referred to in the following sentence as a modified current mirror 306). This would result in both the HF and LF components of the source signal Is being provided to the input of the modified current mirror 306, with only the LF components appearing at the output of the modified current mirror 306, thereby causing such a modified embodiment to achieve the same effect as FIG. 3B.

Figure 4A:
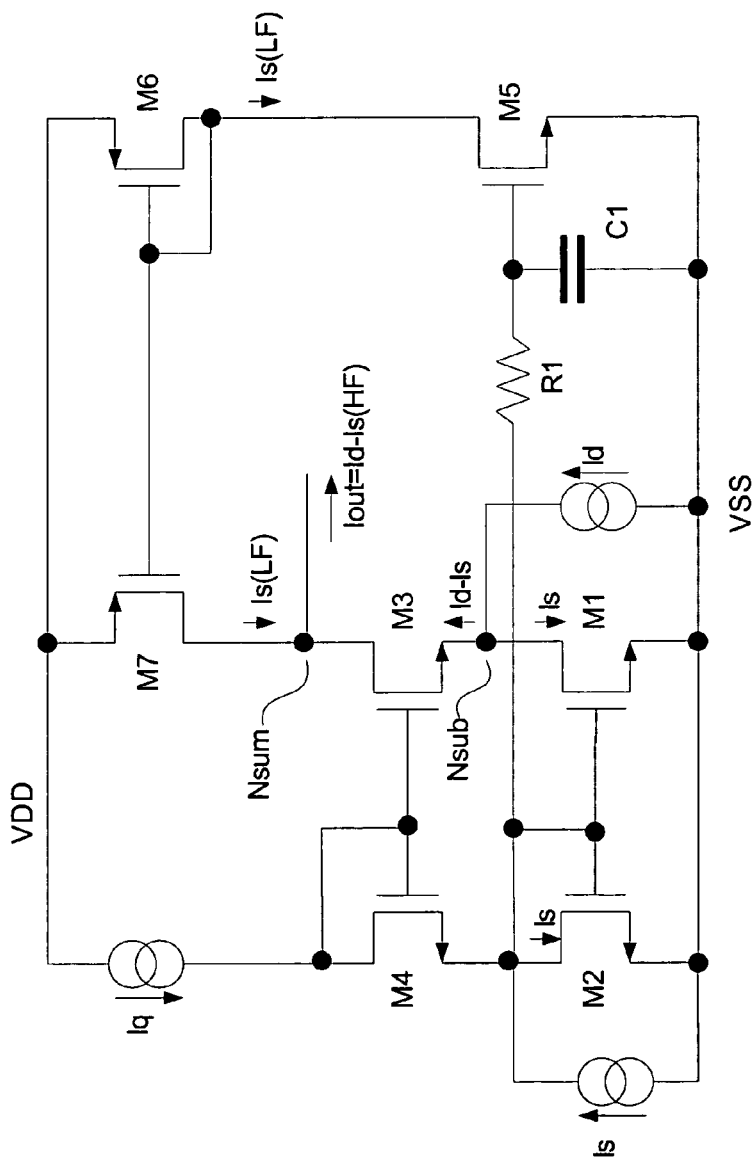
FIG. 4A is a lower level circuit implementation of the high level circuit diagram of FIG. 3A, in accordance with an embodiment of the present invention.
Figure 4B:
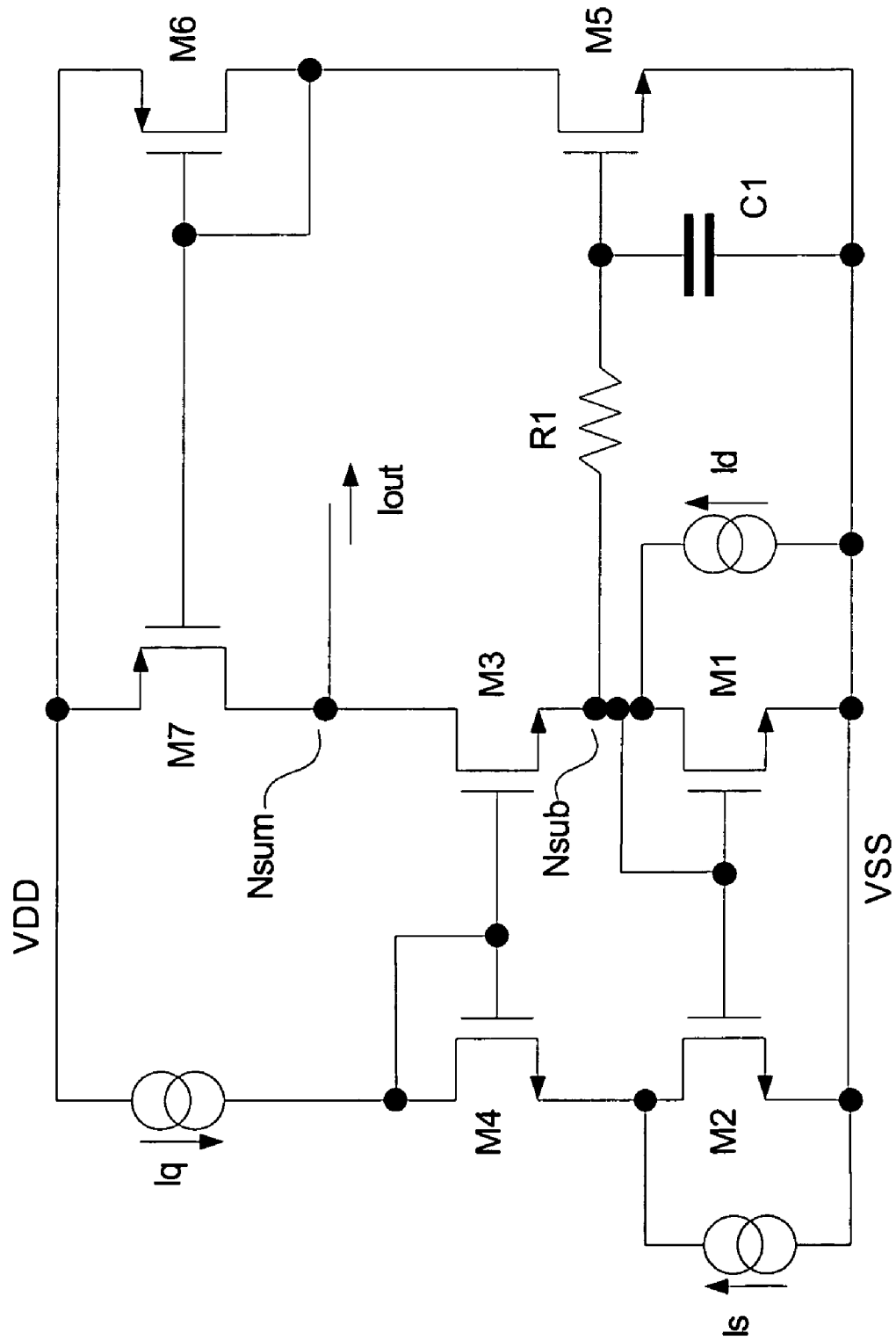
FIG. 4B is a lower level circuit implementation of the high level circuit diagram of FIG. 3B, in accordance with an embodiment of the present invention.

The LPF 308 shown in FIGS. 3A and 3B can be implemented, in accordance with embodiments of the present invention, using a simple RC circuit (as shown in FIGS. 4A and 4B). An exemplary cutoff frequency is 100 KHz. The cutoff frequency of the LPF can be adjusted by adjusting the resistor and/or capacitor values of the LPF 308. For example, the capacitor of the LPF 308 can be implemented using an array of selectable capacitors of different sizes, that can be switched in and out of the circuit. One or more capacitors can be selected at once, to provide the appropriate cutoff frequency.

The bandwidth of the circuits of FIGS. 3A and 3B are current dependent. Accordingly, to ensure that a suitable bandwidth is obtained under all input conditions, a bias current can be used to setup a suitable quiescent current through the transistors of the circuits, in accordance with embodiments of the present invention. Such embodiments will now be described with reference to FIGS. 4A and 4B.

FIG. 4A is similar to FIG. 3A, but with the addition of a biasing current source that provides a biasing current signal Iq, and additional transistors M3 and M4. FIG. 4B is similar to FIG. 3B, but with the addition of the biasing current source and transistor M4. In FIGS. 4A and 4B, transistor M4 and transistor M3 are connected in a voltage follower configuration with their gates connected together, and the drain of transistor M4 connected to the gate of transistor M4.

The source of transistor M4 is connected to the drain of transistor M2. The source of transistor M3 is connected to the drain of transistor M1. In this manner, the voltages across transistors M1 and M2 are balanced. This arrangement also provides the proper impedance translation from inputs (low impedance) to the output (high impedance). The biasing current Iq is cancelled out by the circuits, and thus the biasing current need not be discussed in further detail.

Figure 5A:
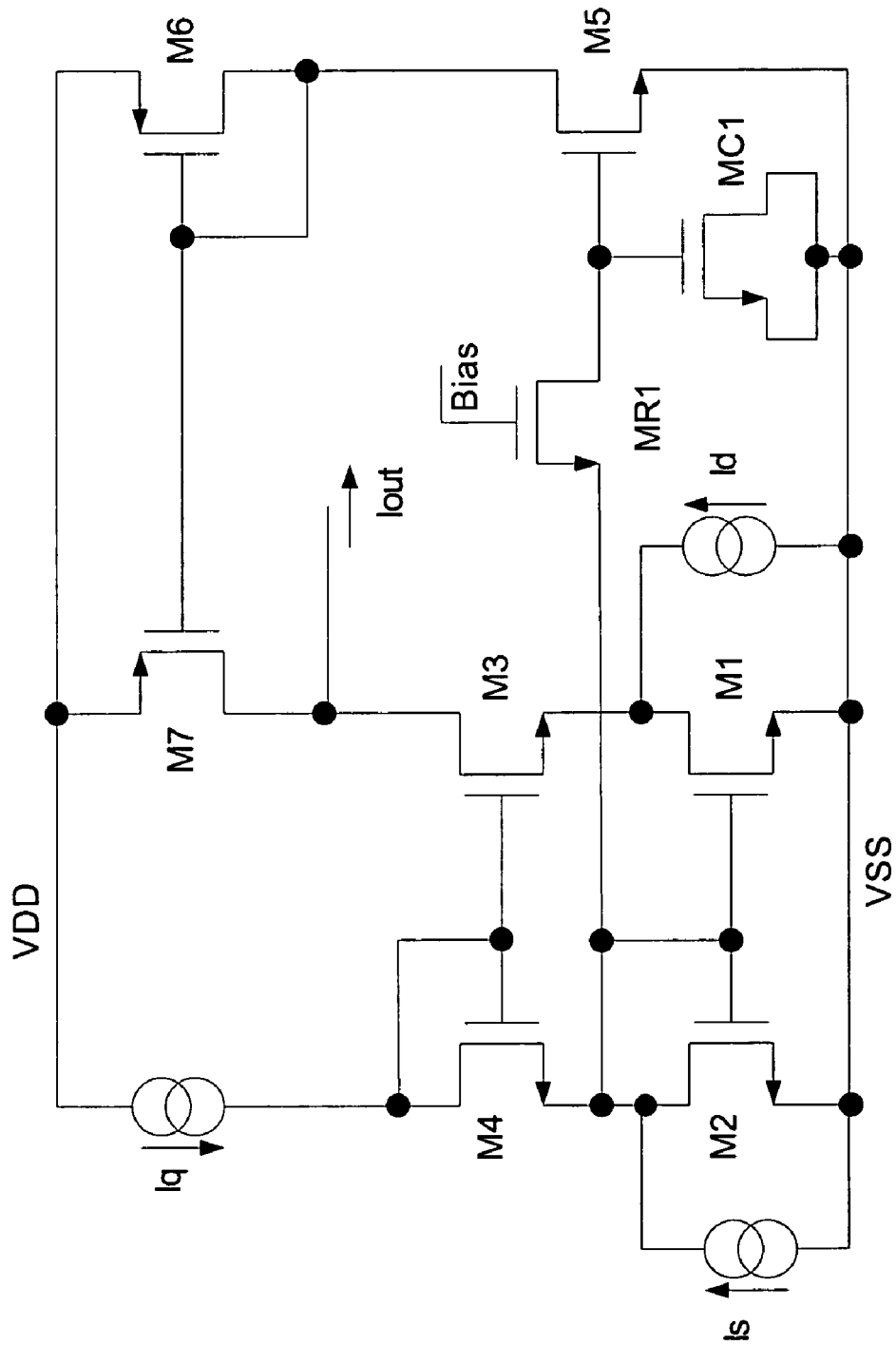
FIG. 5A is similar to FIG. 4A, except that the resistor and capacitor functions shown in FIG. 4A are specifically implemented using transistors, in accordance with an embodiment of the present invention.
Figure 5B:
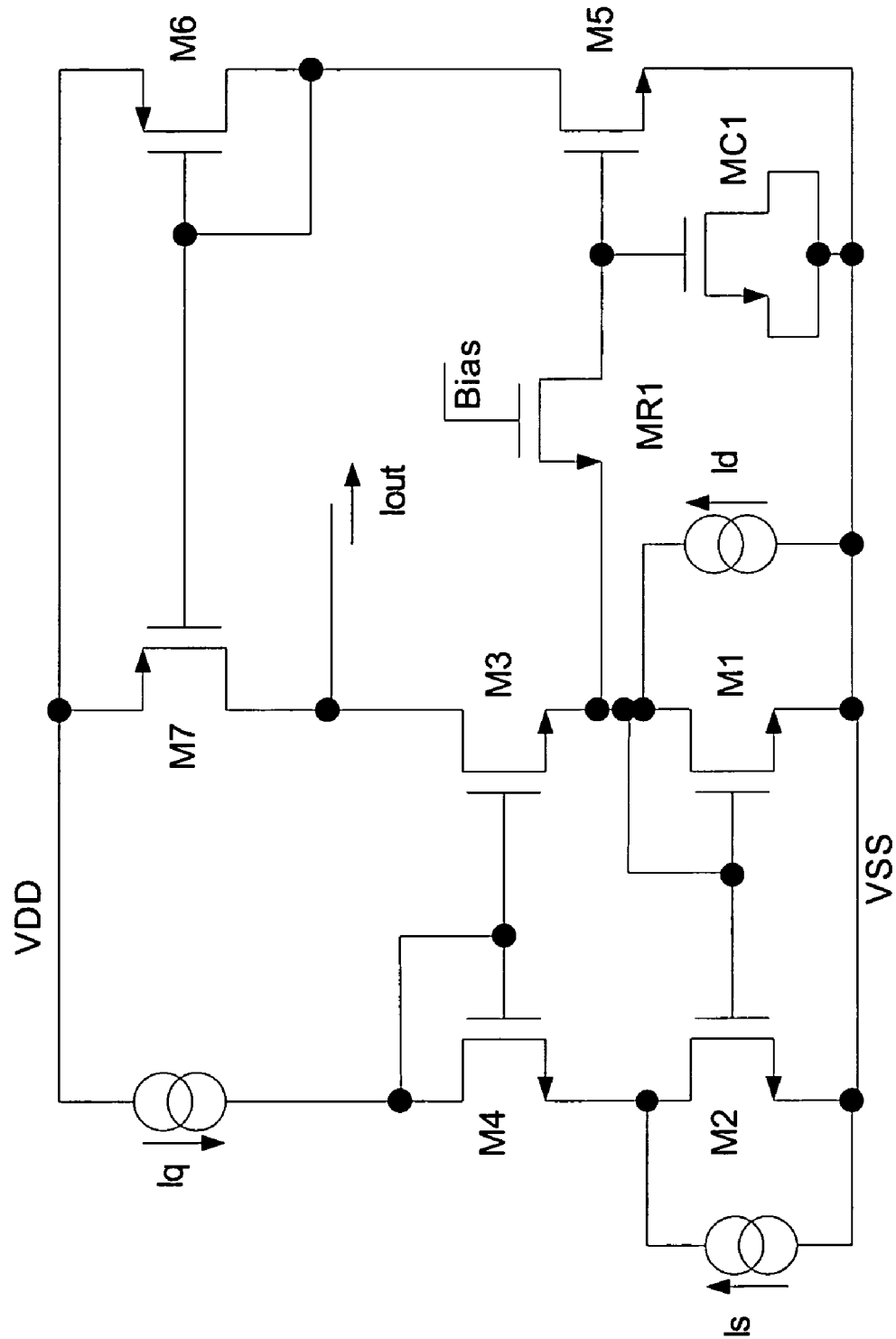
FIG. 5B is similar to FIG. 4B, except that the resistor and capacitor functions shown in FIG. 4B are specifically implemented using transistors, in accordance with an embodiment of the present invention.

In FIGS. 4A and 4B, the LPF 308 is shown as an RC circuit including a resistor R1 and a capacitor C1. The resistor R1 can be, e.g., on the order of tens to hundreds of Kilo-ohms (KΩ). The resistance R1 can be implemented using a discrete resistor that includes a resistive material, such as with a poly-resistor. More likely, the resistor R1 will be implemented using a transistor, e.g., a MOS device with a controlled gate voltage that puts the device in the triode region, thereby causing it to act as a resistor. The capacitor C1 can be, e.g. on the order of 5 to 50 Pico-farads. The capacitor C1 can be implemented using a discrete capacitor. More likely, the capacitor C1 will be implemented using a transistor, e.g., a MOS device with its source and drain tied together. For example, FIGS. 5A and 5B respectively show the circuits of FIGS. 4A and 4B, but with the resistor R1 and the capacitor C1 implemented using transistors. The values of R1 and/or C1 can be adjusted to provide adjustment to the time constant for the filter pole.

The fine gain adjustment, shown as block 202 in FIG. 2, can be achieved by adjusting the size of transistor M2 and/or adjusting the size of transistor M1 together with transistors M5 and/or M6 and M7. For example, transistor M2 can be implemented using an array of selectable transistors of different sizes, that can be switched in and out of the circuit at their respective sources. One or more of the transistors can be selected at once, to provide the appropriate fine gain. A gain of the circuit from the source signal side is defined by a ratio of transistor sizes of M1 with respect to M2. A gain from the data signal side preferably remains one under all conditions, and the mirror path through transistors M5, M6 and M7 ensures that the output offset remains substantially unchanged under all conditions.

A current bias path through transistor M7, via transistors M6 and M5 is shown in its most simple form for clarity. In general, the current mirror 306 should be cascoded to minimize static offset errors and improve the power-supply rejection.

While the transistors M1–M5 are shown as NMOS transistors, and transistors M6–M7 are shown as PMOS transistors, one of ordinary skill in the art would understand that transistors M1–M5 can be replaced with npn BJT transistors, and transistors M6–M7 can be replaced with pnp BJT transistors. Furthermore, one of ordinary skill in the art would also appreciate that the circuits could essentially be flipped by replacing NMOS transistors with PMOS transistors, and PMOS transistors with NMOS transistors, and appropriately adjusting the supply rail voltages. The same holds true for replacing npn BJT transistors with pnp BJT transistor, and replacing pnp BJT transistors with npn BJT transistors.

While embodiments of the present invention are useful for application with optical storage devices, the embodiments can be applied to other applications where a single circuit can obtain coherent waveforms from both a source and a derived data stream.

The forgoing description is of the preferred embodiments of the present invention. These embodiments have been provided for the purposes of illustration and description, but are not intended to be exhaustive or to limit the invention to the precise forms disclosed. Many modifications and variations will be apparent to a practitioner skilled in the art. Embodiments were chosen and described in order to best describe the principles of the invention and its practical application, thereby enabling others skilled in the art to understand the invention. Slight modifications and variations are believed to be within the spirit and scope of the present invention. It is intended that the scope of the invention be defined by the following claims and their equivalents.

What is claims is:

1. A method for performing coherent noise cancellation, comprising:
    subtracting a source signal from a data signal, at either an output or an input of a first current mirror, to produce a first signal that includes the data signal minus both low and high frequency components of the source signal;
    low pass filtering the source signal to produce a second signal that includes the low frequency components of the source signal;
    providing the second signal to an input of a second current mirror; and
    adding the first signal to the second signal at the output of the second current mirror to produce an output signal that includes the data signal minus the high frequency components of the source signal.

2. A coherent noise cancellation circuit, comprising:
    a first current mirror including an input and an output, wherein the input of the first current mirror receives a source signal, and wherein the output of the first current mirror is connected to a first node;
    a transistor including a control terminal and a current path, wherein the control terminal controls current flow through the current path;
    a low pass filter including an input and an output, wherein the input of the low pass filter is connected to the input of the first current mirror, and wherein the output of the low pass filter is connected to the control terminal of the transistor; and
    a second current mirror including an input and an output, wherein the input of the second current mirror is connected to the current path of the transistor, and wherein the output of the second current mirror is connected to a second node;
    wherein the first node receives a data signal; and
    wherein the first node and the second node are connected together.

3. The circuit of claim 2, wherein the first node and the second node are connected together without an intervening component.

4. The circuit of claim 2, wherein the first node and the second node are connected together by a current path of a further transistor.

5. The circuit of claim 2, wherein the transistor comprises a CMOS transistor, the control terminal comprises a gate of the CMOS transistor, and the current path comprises a drain source path of the CMOS transistor.

6. The circuit of claim 2, wherein the transistor comprises a BJT transistor, the control terminal comprises a base of the BJT transistor, and the current path comprises a collector emitter path of the BJT transistor.

7. The circuit of claim 2, wherein the first current mirror comprises N channel transistors and the second current mirror comprises P channel transistors.

8. A coherent noise cancellation circuit, comprising:
a fast current mirror including an input and an output, wherein the input of the fast current mirror receives a source signal, and wherein the output of the fast current mirror is connected to a first node;
a slow current mirror including an input and an output wherein the slow current mirror comprises a pair of transistors with a low pass filter connected between control terminals of the pair of transistors, and wherein the output of the slow current mirror is connected to a second node;
a further transistor including a control terminal and a current path that is controlled by the control terminal, wherein the control terminal of the further transistor is connected to the input of the fast current mirror, wherein the current path of the further transistor is connected to the input of the slow current mirror;
wherein the first node receives a data signal; and
wherein the first node and the second node are connected together.

9. The circuit of claim 8, wherein the first node and the second node are connected together without an intervening component.

10. The circuit of claim 9, wherein the first node and the second node are connected together by a current path of another transistor.

11. A coherent noise cancellation circuit, comprising:
a first current mirror including an input and an output, wherein the output of the first current mirror receives a source signal, and wherein the input of the first current mirror is connected to a first node;
a transistor including a control terminal and a current path, wherein the control terminal controls current flow through the current path;
a low pass filter including an input and an output, wherein the input of the low pass filter is connected to the input of the first current mirror, and wherein the output of the low pass filter is connected to the control terminal of the transistor; and
a second current mirror including an input and an output, wherein the input of the second current mirror is connected to the current path of the transistor, and wherein the output of the second current mirror is connected to a second node;
wherein the first node receives a data signal; and
wherein the first node and the second node are connected together.

12. The circuit of claim 11, wherein the first node and the second node are connected together without an intervening component.

13. The circuit of claim 11, wherein the first node and the second node are connected together by a current path of a further transistor.

14. The circuit of claim 11, wherein the transistor comprises a CMOS transistor, the control terminal comprises a gate of the CMOS transistor, and the current path comprises a drain source path of the CMOS transistor.

15. The circuit of claim 11, wherein the transistor comprises a BJT transistor, the control terminal comprises a base of the BJT transistor, and the current path comprises a collector emitter path of the BJT transistor.

16. The circuit of claim 11, wherein the first current mirror comprises N channel transistors and the second current mirror comprises P channel transistors.

17. A coherent noise cancellation circuit comprising:
a fast current mirror including an input and an output wherein the output of the fast current mirror receives a source signal, and wherein the input of the fast current mirror is connected to a first node;
a slow current mirror including an input and an output, wherein the slow current mirror comprises a pair of transistors with a low pass filter connected between control terminals of the pair of transistors, and wherein the output of the slow current mirror is connected to a second node;
a further transistor including a control terminal and a current path that is controlled by the control terminal, wherein the control terminal of the further transistor is connected to the input of the fast current mirror, wherein the current path of the further transistor is connected to the input of the slow current mirror;
wherein the first node receives a data signal; and
wherein the first node and the second node are connected together.

18. The circuit of claim 17, wherein the first node and the second node are connected together without an intervening component.

19. The circuit of claim 17, wherein the first node and the second node are connected together by a current path of another transistor.

20. A noise cancellation circuit, comprising:
a transistor (M1) having a gate, a drain and a source, the source of said transistor (M1) connected to a rail voltage (VSS);
a transistor (M2) having a gate connected to the gate of transistor (M1), a source connected to the rail voltage (VSS), and a drain that receives a source signal Is;
a transistor (M3) having a gate, a drain and a source, the source of said transistor (M3) connected to the drain of said transistor (M1) and receiving a data signal (Id), the drain of said transistor (M3) connected to an output node (Nout);
a transistor (M4) having a source connected to the drain of said transistor (M2), and a gate and a source connected together and to the gate of said transistor (M3);
a transistor (M5) having a gate, a drain and a source, the source of said transistor (M5) connected to the rail voltage (VSS);
a resistor (R1) connected between the gate of said transistor (M5) and the drain of transistor (M2);
a capacitor (C1) connected between the gate of said transistor (M5) and the rail voltage (VSS); and
a current mirror (306) having an input and an output, the input of said current mirror (306) connected to the drain of said transistor (M5), the output of said current mirror (306) connected to the output node (Nout).

21. The circuit of claim 20, wherein the source and the gate of said transistor (M4), and the gate of said transistor (M3), receive a biasing current (Iq).

22. The circuit of claim 21, further comprising a biasing current source connected between a supply rail voltage (VDD) and the drain of said transistor (M4), said biasing current source providing the biasing current (Iq) to the source and the gate of said transistor (M4), and to the gate of said transistor (M3).

23. The circuit of claim 20, wherein said current mirror (306) comprises:
a transistor (M6) that includes a gate, a drain and a source, the gate and the drain of said transistor (M6) connected together and forming the input of said current mirror (306), the source of said transistor (M6) connected to a supply rail voltage VDD; and
a transistor (M7) that includes a gate connected to the gate of said transistor (M6), a source connected to the supply rail voltage (VDD), and a drain forming the output of said current mirror (306).

24. The circuit of claim 20, wherein said resistor (R1) comprises a discrete resistor element.

25. The circuit of claim 20, wherein said resistor (R1) comprises a transistor (MR1) that includes a gate that receives a bias current, and a drain source path connected between the gate of said transistor (M5) and the drain of said transistor (M2).

26. The circuit of claim 20, wherein the capacitor (C1) comprises a discrete capacitor element.

27. The circuit of claim 20, wherein the capacitor (C1) comprises a transistor (MC1) that includes a gate connected to the gate of said transistor (M5), and a source and a drain that are connected together to the supply rail voltage (VSS).

28. The circuit of claim 20, wherein each said transistor (M1–M5) comprises an NMOS transistor.

29. The circuit of claim 20, wherein each said transistor (M1–M5) comprises a PMOS transistor.

30. A noise cancellation circuit, comprising:
- a transistor (M1) having a gate, a drain and a source, the source of said transistor (M1) connected to a rail voltage (VSS), the gate and the drain of said transistor (M1) connected together;
- a transistor (M2) having a gate connected to the gate of transistor (M1), a source connected to the rail voltage (VSS), and a drain that receives a source signal (Is);
- a transistor (M3) having a gate, a drain and a source, the source of said transistor (M3) connected to the drain of said transistor (M1) and receiving a data signal (Id), the drain of said transistor (M3) connected to an output node (Nout);
- a transistor (M4) having a source connected to the drain of said transistor (M2), and a gate and a source connected together and to the gate of said transistor (M3);
- a transistor (M5) having a gate, a drain and a source, the source of said transistor (M5) connected to the rail voltage (VSS);
- a resistor (R1) connected between the gate of said transistor (M5) and the drain of said transistor (M1);
- a capacitor (C1) connected between the gate of said transistor (M5) and the rail voltage (VSS); and
- a current mirror (306) having an input and an output, the input of said current mirror connected to the drain of said transistor (M5), the output of said current mirror (306) connected to the output node (Nout).

31. The circuit of claim 30, wherein the source and the gate of said transistor (M4), and the gate of said transistor (M3), receive a biasing current (Iq).

32. The circuit of claim 31, further comprising a biasing current source connected between a supply rail voltage (VDD) and the drain of said transistor (M4), said biasing current source providing the biasing current (Iq) to the source and the gate of said transistor (M4), and to the gate of said transistor (M3).

33. The circuit of claim 30, wherein said current mirror (306) comprises:
- a transistor (M6) that includes a gate, a drain and a source, the gate and the drain of said transistor (M6) connected together and forming the input of said current mirror (306), the source of said transistor (M6) connected to a supply rail voltage (VDD); and
- a transistor (M7) that includes a gate connected to the gate of said transistor (M6), a source connected to the supply rail voltage (VDD), and a drain forming the output of said current mirror (306).

34. The circuit of claim 30, wherein said resistor (R1) comprises a discrete resistor element.

35. The circuit of claim 30, wherein said resistor (R1) comprises transistor (MR1) that includes a gate that receives a bias current, and a drain source path connected between the gate of said transistor (M5) and the drain of said transistor (M1).

36. The circuit of claim 30, wherein the capacitor (C1) comprises a discrete capacitor element.

37. The circuit of claim 30, wherein the capacitor (C1) comprises a transistor (MC1) that includes a gate connected to the gate of said transistor (M5), and a source and a drain that are connected together to the supply rail voltage (VSS).

38. The circuit of claim 30, wherein each said transistor (M1–M5) comprises an NMOS transistor.

39. The circuit of claim 30, wherein each said transistor (M1–M5) comprises a PMOS transistor.

* * * * *